US008133789B1

(12) United States Patent
Cooper et al.

(10) Patent No.: US 8,133,789 B1
(45) Date of Patent: Mar. 13, 2012

(54) SHORT-CHANNEL SILICON CARBIDE POWER MOSFET

(75) Inventors: James A. Cooper, West Lafayette, IN (US); Maherin Matin, San Jose, CA (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 12/463,054

(22) Filed: May 8, 2009

Related U.S. Application Data

(62) Division of application No. 10/821,613, filed on Apr. 9, 2004, now abandoned.

(60) Provisional application No. 60/462,127, filed on Apr. 11, 2003.

(51) Int. Cl.
*H01L 21/336* (2006.01)

(52) U.S. Cl. ........ 438/285; 438/105; 438/275; 438/931; 257/327; 257/E29.04; 257/E29.104; 257/E29.257

(58) Field of Classification Search .................. 438/105, 438/275, 931, 285; 257/327
See application file for complete search history.

(56) References Cited

U.S. PATENT DOCUMENTS

| 4,070,690 | A | | 1/1978 | Wickstrom |
| 4,893,160 | A | | 1/1990 | Blanchard |
| 5,506,421 | A | | 4/1996 | Palmour |
| 5,637,898 | A | | 6/1997 | Baliga |
| 5,780,324 | A | | 7/1998 | Tokura et al. |
| 5,786,251 | A | * | 7/1998 | Harris et al. ........... 438/268 |
| 5,801,417 | A | | 9/1998 | Tsang et al. |
| 5,814,859 | A | | 9/1998 | Ghezzo et al. |
| 6,054,752 | A | | 4/2000 | Hara et al. |
| 6,130,458 | A | | 10/2000 | Takagi et al. |
| 6,150,671 | A | | 11/2000 | Harris et al. |
| 6,180,958 | B1 | | 1/2001 | Cooper |
| 6,236,069 | B1 | * | 5/2001 | Shinohe et al. ........... 257/138 |
| 6,238,980 | B1 | * | 5/2001 | Ueno ........... 438/268 |
| 6,297,100 | B1 | | 10/2001 | Kumar et al. |
| 6,316,806 | B1 | | 11/2001 | Mo |

(Continued)

FOREIGN PATENT DOCUMENTS

JP 2000-228528 * 8/2000

(Continued)

OTHER PUBLICATIONS

Capano et al., "Dopant Activation and Surface Morphology of Ion Implanted 4H- and 6H-Silicon Carbide," Journal of Electronic Materials, vol. 27, No. 4, 1998, pp. 370-376.

(Continued)

*Primary Examiner* — A. Sefer
(74) *Attorney, Agent, or Firm* — William F. Bahret

(57) ABSTRACT

A silicon carbide power MOSFET having a drain region of a first conductivity type, a base region of a second conductivity type above the drain region, and a source region of the first conductivity type adjacent an upper surface of the base region, the base region including a channel extending from the source region through the base region adjacent a gate interface surface thereof, the channel having a length less than approximately 0.6 µm, and the base region having a doping concentration of the second conductivity type sufficiently high that the potential barrier at the source end of the channel is not lowered by the voltage applied to the drain. The MOSFET includes self-aligned base and source regions as well as self-aligned ohmic contacts to the base and source regions.

8 Claims, 6 Drawing Sheets

U.S. PATENT DOCUMENTS

| | | | |
|---|---|---|---|
| 6,344,663 B1 * | 2/2002 | Slater et al. | 257/77 |
| 6,362,495 B1 | 3/2002 | Schoen et al. | |
| 6,465,807 B1 | 10/2002 | Ueno | |
| 6,573,534 B1 | 6/2003 | Kumar et al. | |
| 6,737,677 B2 | 5/2004 | Shimoida et al. | |
| 6,815,293 B2 | 11/2004 | Disney et al. | |
| 6,894,319 B2 | 5/2005 | Kobayashi et al. | |
| 2003/0073270 A1 | 4/2003 | Hisada et al. | |
| 2004/0145011 A1 | 7/2004 | Hsu et al. | |

FOREIGN PATENT DOCUMENTS

JP    2000-299475    10/2000

OTHER PUBLICATIONS

Shenoy, Jayarama et al., "High-Voltage Double-Implanted Power MOSFET's in 6H-SiC," IEEE 1996, 54$^{th}$ Annual Device Research Conference, Late News, 4 pgs.

Shenoy, Jayarama et al., "High-Voltage Double-Implanted Power MOSFET's in 6H-SiC," IEEE Electron Device Letters, vol. 18, No. 3, Mar. 1997, pp. 93-95.

Capano et al., "Dopant Activation and Surface Morphology of Ion Implanted 4H- and 6H-Silicon Carbide," Journal of Electronic Materials, vol. 27, No. 4, 1998, pp. 370-376.

K.S. Oh, MOSFET Basics, Fairchild Semiconductor App. Note AN9010, Jul. 2000, pp. 1-37.

"ONR/MURI on Manufacturable Power Switching Devices and Program Overview," [online], c.2000, [retrieved Sep. 22, 2005]. Retrieved from the Internet: <http://www.ecn.purdue.edu/WBG/MURI/> (26 pgs).

Argarwal, A.K. et al., "1.1 kV 4H-SiC Power UMOSFET's," IEEE Electron Device Letters, vol. 18, No. 12, Dec. 1997, pp. 586-588.

Sze, S.M., "Physics of Semiconductor Devices," second edition, 2 pgs.

Cooper, J., "Advances in SiC MOS Technology," *Physica Status Solidi (a)*, vol. 162, No. 1, 1997, pp. 305-320.

J.A. Cooper et al., "Status and Prospects for SiC Power MOSFETs," *IEEE Transactions on Electron Devices*, vol. 49, No. 4, Apr. 2002, pp. 658-664.

* cited by examiner

SHORT-CHANNEL SILICON CARBIDE POWER MOSFET

CROSS-REFERENCE TO RELATED APPLICATION

This application is a divisional of patent application Ser. No. 10/821,613, filed Apr. 9, 2004, and claims the benefit of Provisional Patent Application. No. 60/462,127, filed Apr. 11, 2003, both of which applications are hereby incorporated by reference along with all references cited therein.

GOVERNMENT RIGHTS

This invention was made with government support under Contract/Grant No. N00014-01-1-0072 awarded by the Office of Naval Research. The government has certain rights in the invention.

BACKGROUND OF THE INVENTION

The present invention relates to power semiconductor devices, and more particularly to power MOSFETs formed in silicon carbide (SiC).

Power MOSFETs are well known for their ability to carry large currents in the on-state while withstanding large breakdown voltages in the off-state. In such a device, current flow between source and drain regions in a semiconductor substrate is controlled by a voltage applied to a gate electrode that is separated from the semiconductor surface by an insulator, typically silicon dioxide. In an n-type enhancement MOSFET, for example, a positive bias on the gate causes a surface inversion layer—or channel—to form in a p-type region under the gate oxide and thereby creates a conductive path between source and drain. The application of a positive drain voltage then produces current flow between drain and source. Lateral and vertical power MOSFET structures in silicon have been explored over the years, the former type having the drain, gate and source terminals on the same surface of the silicon wafer, the latter type having the source and drain on opposite surfaces of the wafer. Several different types of vertical power MOSFETs have been proposed, including the double-diffused MOSFET (DMOSFET) and the UMOSFET. These and other power MOSFETs are described in a textbook by B. Jayant Baliga entitled Power Semiconductor Devices, PWS Publishing Co. (1996), the disclosure of which is hereby incorporated herein by reference.

Although silicon has been the material of choice for many semiconductor applications, its fundamental electronic structure and characteristics prevent its utilization beyond certain parameters. Thus, interest in power MOSFET devices has turned from silicon to other materials, including silicon carbide. SiC power switching devices have significant advantages over silicon devices, including faster switching speed, lower specific on-resistance and thus lower power losses. SiC has a breakdown electric field that is an order of magnitude higher than that of silicon, which allows for a thinner drift region and thus a lower drift region resistance. The resistance of the drift region is proportional to the region's thickness and inversely proportional to the doping. With decreases in thickness and increases in doping of the drift region, the specific on-resistance of a SiC device can be 100-200 times lower than that of a comparable silicon device of equal voltage rating.

The DMOS and UMOS structures remain of interest for SiC MOSFETs, although in this context the term "DMOSFET" is used to refer to a "double-implanted" MOSFET, in which the base and source regions are produced by ion implantation rather than thermal diffusion because diffusion is impractical in SiC due to very low diffusion coefficients in the material. Examples of such devices are described in U.S. Pat. No. 5,506,421 to Palmour, U.S. Pat. No. 6,180,958 to Cooper, and U.S. Pat. No. 6,238,980 to Ueno, all of which patents are incorporated by reference.

In spite of substantial activity in this area, the potential advantages of SiC for power MOSFETs have not been fully realized. There is a continuing need for improvements, including reductions in specific on-resistance without undesirable side-effects, and more reliable or otherwise improved methods of fabrication.

SUMMARY OF THE INVENTION

The present invention provides high voltage power MOSFETs in silicon carbide that have channel lengths considerably shorter than possible with conventional techniques, and thereby provides reduced specific on-resistance and increased on-state current density in such SiC MOSFETs. The advantage of a short channel can be seen from the expression for the specific on-resistance (resistance×area product) due to the MOSFET channel:

$$R_{on,sp}^{MOS} = \frac{LS}{\mu_{CH} \varepsilon_{ox} E_{ox,max}}$$

where L is the channel length, S is the half pitch of the MOSFET cell, $\mu_{CH}$ is the MOS channel mobility, $\varepsilon_{ox}$ is the dielectric constant of the insulator, and $E_{OX,MAX}$ is the maximum tolerable electric field in the insulator. A reduction in channel length produces a proportionate reduction in $R_{on,sp}$ of the MOSFET channel, which is a very important parameter for a power MOSFET as it gives the current handling capability of a device as well as the power dissipation during the on-state.

Lower specific on-resistance is continually of interest for power MOSFETs of all SiC polytypes, but is particularly desirable for 4H-SiC devices. 4H-SiC is the material of choice for high voltage power MOSFETs for its high critical electric field and higher bulk mobility and lesser mobility anisotropy compared to 6H-SiC material. However, 4H-SiC MOSFETs suffer from low inversion channel mobility resulting in high specific on-resistance.

The present invention contemplates channel lengths in the range of about 0.5 μm or less for SiC DMOSFETs and as low as about 0.2 μm for SiC UMOSFETs. Such reductions reduce the specific on-resistance of the MOS channel of such devices by a factor of 5-10 relative to comparable SiC devices. This is independent of, and in addition to, any reduction that may be obtained by increasing the channel mobility, $\mu_{CH}$.

Additional structural changes are provided according to certain aspects of the invention in order to minimize unwanted side-effects of a short channel. For example, the doping of the base region is increased in order to avoid "punchthrough" between the source region and the drift layer, i.e., a merging of the associated depletion regions in the blocking state. As another aspect of the invention, a method is provided for reducing the doping of the channel portion of the base region in order to reduce the electric field in the gate oxide of a SiC power MOSFET at threshold. The conventional method of counter-doping in DMOSFETs reduces the threshold voltage and increases channel mobility, but the counter-doped layer also increases the oxide field in the blocking state, thus reducing the blocking voltage. This invention preserves the benefits of the counter-doped layer in the on-state while avoiding the disadvantages in the blocking state.

These and other aspects and advantages of the present invention will become more apparent upon reading the following detailed description of preferred embodiments in conjunction with the accompanying drawings.

DESCRIPTION OF PREFERRED EMBODIMENTS

Figure 1A:
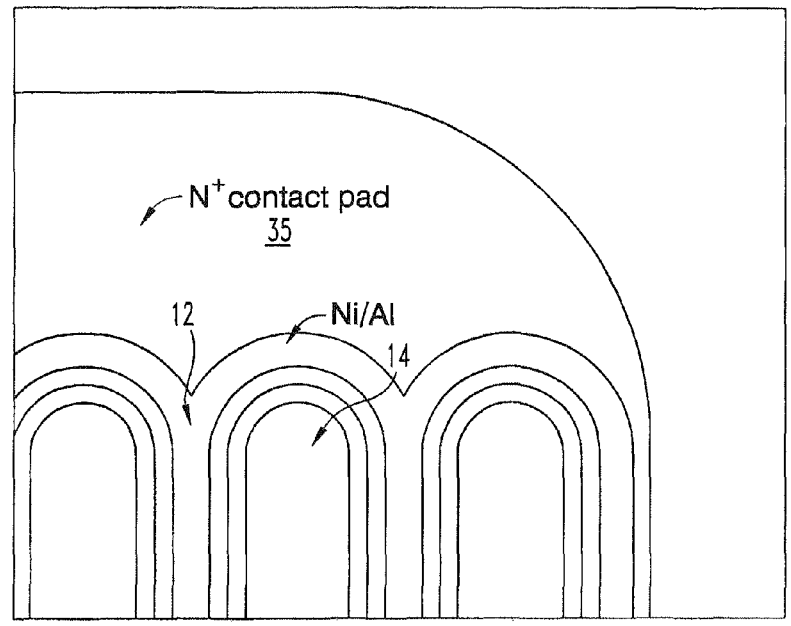
FIGS. 1A and 1B illustrate the front view and cross-section, respectively, of a representative portion of one embodiment of a short-channel SiC DMOSFET according to the present invention.

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

The channel length, $L_{ch}$, which is the distance between the source and drift regions at the interface between the semiconductor and the gate oxide, is lithographically defined in a SiC DMOSFET by ion implantations of the source and base regions. This limits the minimum channel length due to a required alignment tolerance between the base and source implant masks during the photolithography process. The present invention eliminates the need for such an alignment tolerance by providing a DMOS fabrication process in which the source implantation is self-aligned with the base implantation.

Figure 1B:
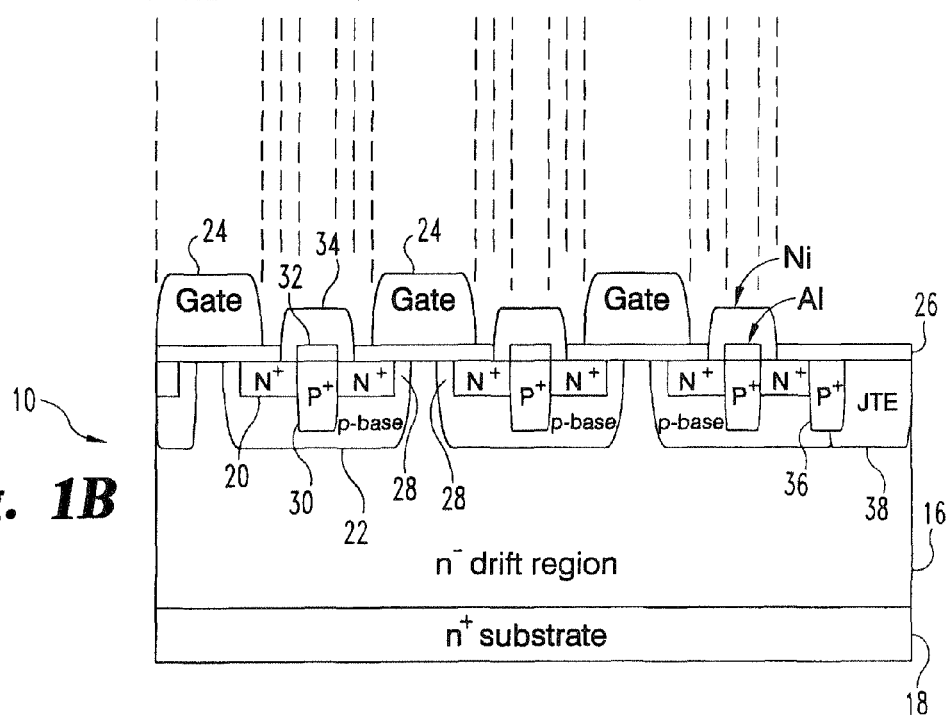

FIGS. 1A and 1B illustrate the front view and cross-section, respectively, of a representative portion of one embodiment of a self-aligned, short-channel SiC DMOSFET 10 according to the present invention. The device has a plurality of source contact fingers 12 interdigitated with a plurality of gate contact fingers 14 on a SiC wafer which, for an n-channel device as shown, has an n⁻ epitaxial layer 16 on an n⁺ substrate 18. A plurality of n⁺ source regions 20 are formed in a corresponding plurality of p-type base regions 22 in the epitaxial layer, which serves as a drift region for the MOSFET. Each gate 24 is separated from two associated source regions 20 by an oxide layer 26 and has associated therewith two channels 28 extending laterally between the n⁺ source regions and n⁻ drift region. A p⁺ contact region 30 extends vertically through the center of each source region, connecting the base region to a metal contact 32, preferably aluminum (Al), formed on the wafer surface. The p⁺ contact 30 is covered by another metal contact 34, preferably nickel (Ni), which is also connected to the source region as shown. The source contacts 34 share a common contact pad 35 at the base end of the fingers as shown in FIG. 1A. An additional p⁺ region 36 and junction termination extension (JTE) 38 are formed at the edge of the device.

Figure 2:
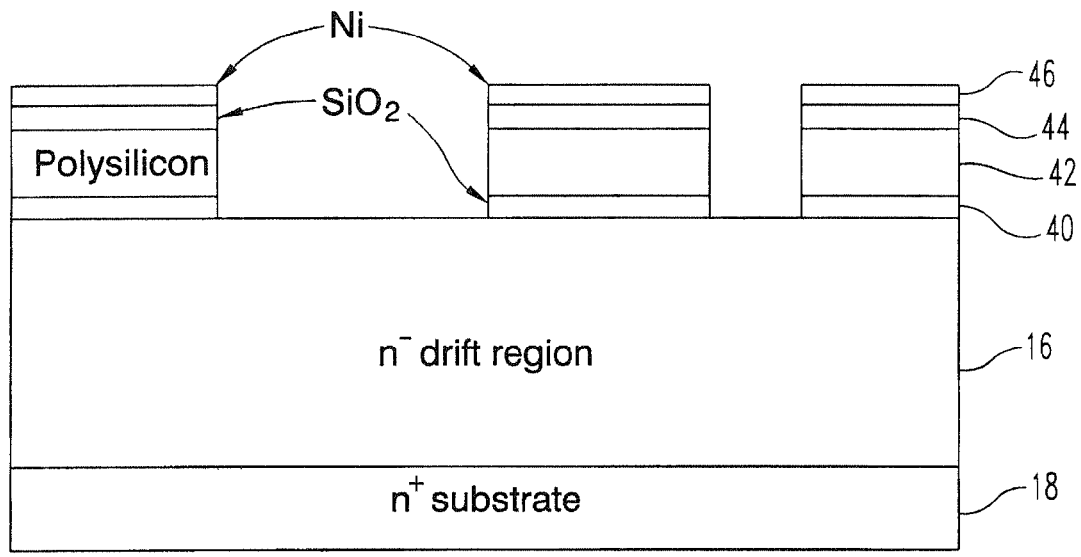
FIGS. 2-8 depict various steps in a fabrication process for a short-channel SiC DMOSFET according to the present invention.

An example of a suitable fabrication process for such a device will be described with reference to FIGS. 2 through 8. One example of a suitable wafer is a 4H-SiC wafer with a heavily doped n⁺ substrate, e.g., having a doping concentration on the order of $6 \times 10^{18}$ cm⁻³, and a relatively lightly doped n⁻ epitaxial layer which may be on the order of 20-50 μm thick and have a doping concentration in the range of $1 - 3 \times 10^{15}$ cm⁻³. Such wafers are commercially available from Cree, Inc. Referring to FIG. 2, a sacrificial $SiO_2$ layer 40 on the order of 400 A° thick, for example, is grown on the surface of the epitaxial layer by thermal oxidation. A polysilicon layer 42 approximately 1.5 μm thick, for example, is deposited on oxide layer 40 and is itself then oxidized to produce a second oxide layer 44 which may be thinner than oxide layer 40. A metal mask 46, e.g., Ti/Ni (titanium/nickel), is formed on the upper oxide layer by e-beam evaporation and liftoff lithography, and is used for reactive ion etching (RIE) of the polysilicon to create an implant mask therefrom for implantation of the p-type base. As shown in FIG. 2, mask 46 includes windows for p-wells (left) and for registration marks (right), and corresponding windows are formed in the polysilicon implant mask in the RIE etching step.

Figure 3:
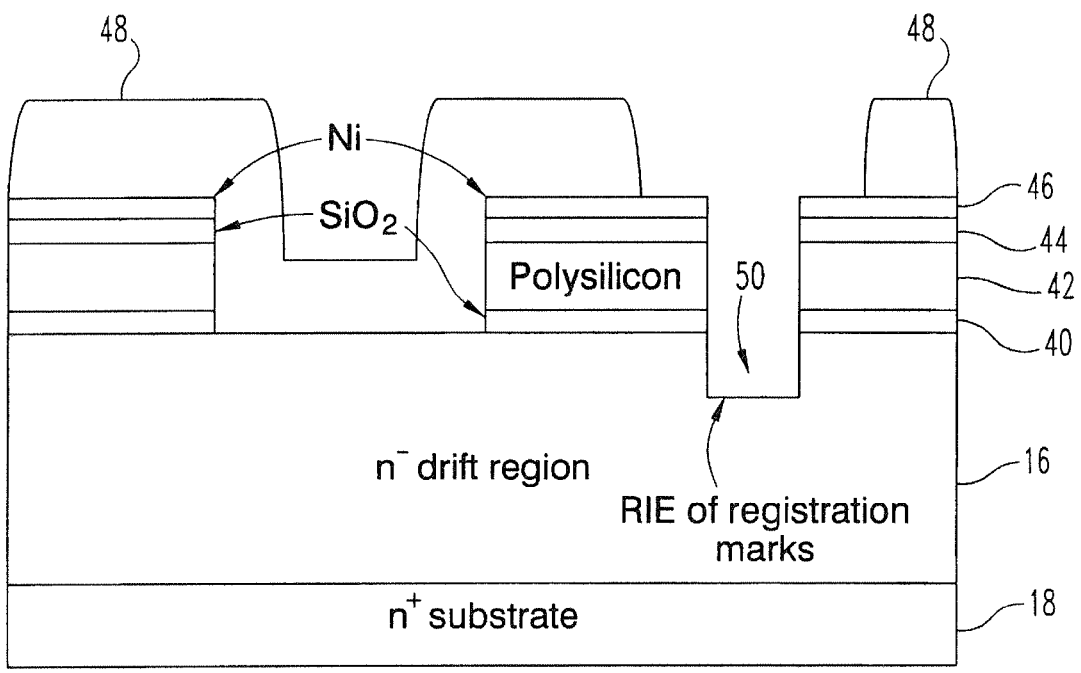

After RIE etching of the polysilicon layer, photoresist 48 is applied and patterned with another mask, as shown in FIG. 3, to cover the locations desired for p-wells but expose the locations desired for registrations marks 50, which are then etched into the SiC wafer by RIE for use in subsequent steps in the fabrication process. The registration marks are self-aligned with the p-well implantation, which saves 1 μm of alignment tolerance, by virtue of including windows for such marks in the metal mask 46. FIG. 3 shows the wafer cross-section after the registration etch. The photoresist and metal mask may be removed after this RIE etching step.

Figure 4:
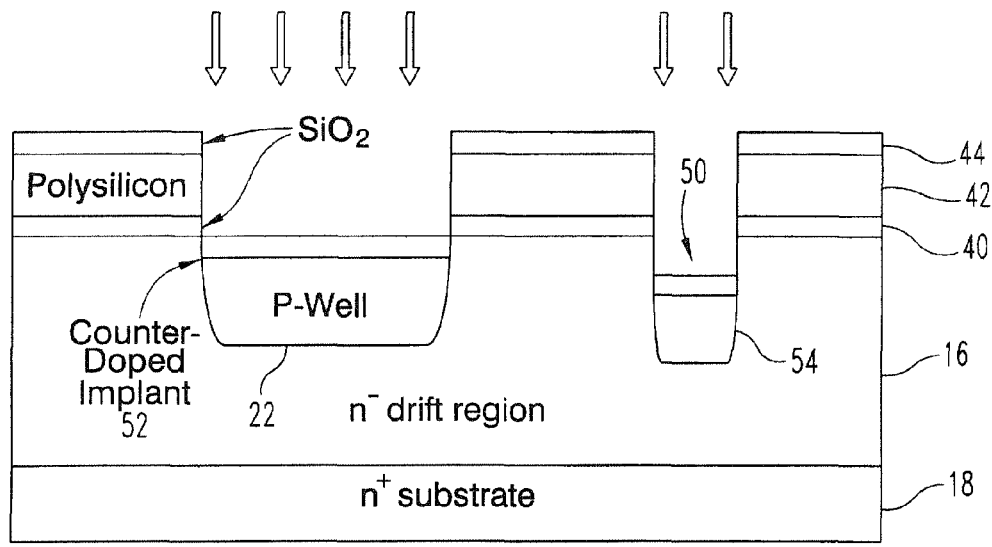

Turning to FIG. 4, the p⁺ base region or p-well 22 may be formed by ion implantation after creation of the registration marks, using the etched polysilicon as a mask. In order to avoid punchthrough, as will be explained, the doping of the p⁺ base region preferably has a peak concentration about $1 - 3 \times 10^{18}$ cm⁻³. A doping concentration on this order of magnitude is sufficiently high that the potential barrier at the source end of the channel is not lowered by the voltage applied to the drain. A retrograde doping profile is preferred, with p-type doping of about $2.5 \times 10^{17}$ cm⁻³ or greater in the channel region and about $1 - 3 \times 10^{18}$ cm⁻³ near the junction with the drift region. In order to avoid high oxide fields at threshold, as will be explained, the channel region is counter-doped, i.e., doped with an n-type dopant, with a doping concentration of about $3 - 8 \times 10^{17}$ cm⁻³, whereby, after compensation, the surface 52 is n-type with a doping of about $1 - 3 \times 10^{17}$ cm⁻³. The counter-doping is performed using the same mask as for the p-well implantation, thereby preventing counter-doping in the JFET region, i.e., the portion of the n⁻ drift region that extends from the oxide-semiconductor interface to the bottom of the p-base. As an incidental matter, a p-type region 54 is also implanted in the registration marks as indicated in the drawing.

Figure 5:
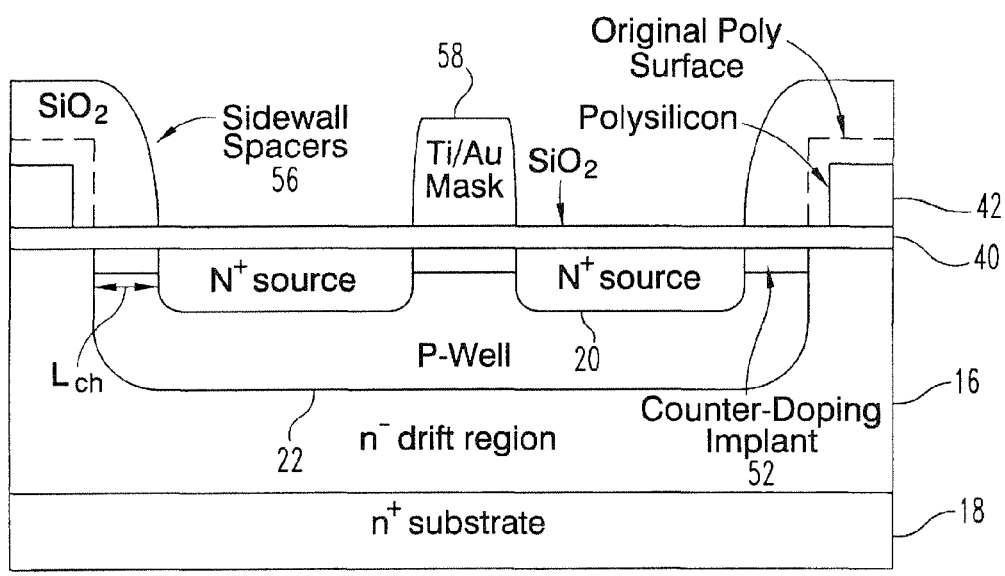

Referring now to FIG. 5, a self-aligned source may be created by first removing the metal mask and upper oxide layer 44 and then oxidizing polysilicon layer 42 to form sidewall spacers 56 each approximately 0.5 μm thick, for example, corresponding to a desired channel length, $L_{ch}$, of 0.5 μm. Alternatively, after removal of the metal mask and upper oxide layer 44, a self-aligned source may be created by depositing another polysilicon layer of thickness equal to the desired channel length, e.g., 0.5 µm, over polysilicon mask 42 and over the exposed wafer surface in the p-well window in the mask, and then performing an anisotropic polysilicon blanket RIE etch to a depth of 0.5 µm. Uniform deposition of, say, 0.5 µm of polysilicon creates a layer which has a recessed portion following the contour of the p-well window but narrower than that window by 0.5 µm on each side, such that the anisotropic RIE etch removes all of the deposited layer except for a spacer 0.5 µm wide (the same width as spacer 56 in FIG. 5) on each sidewall of the window in the polysilicon mask, thereby establishing the desired channel length, $L_{ch}$. Still referring to FIG. 5, another metal mask 58, e.g., Ti/Au, is formed over the center of each p-well to block the implantation of n$^+$ dopant in those areas where a p$^+$ contact region is to be implanted later. The n$^+$ source implantation is then performed by implanting nitrogen, for example, at a sufficient dose to create a peak concentration on the order of $1\times10^{20}$ cm$^{-3}$.

Figure 6:
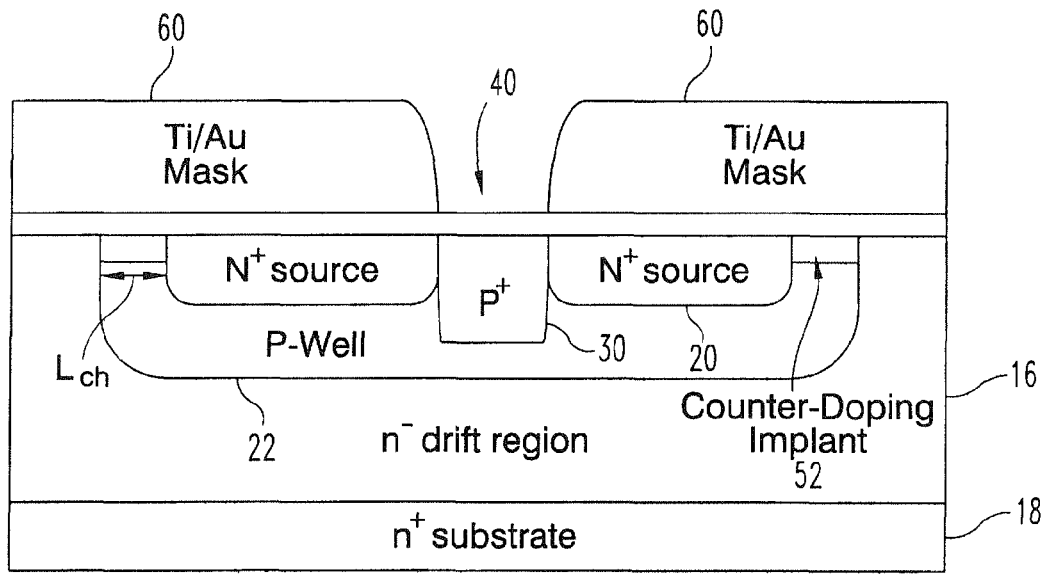
Figure 7:
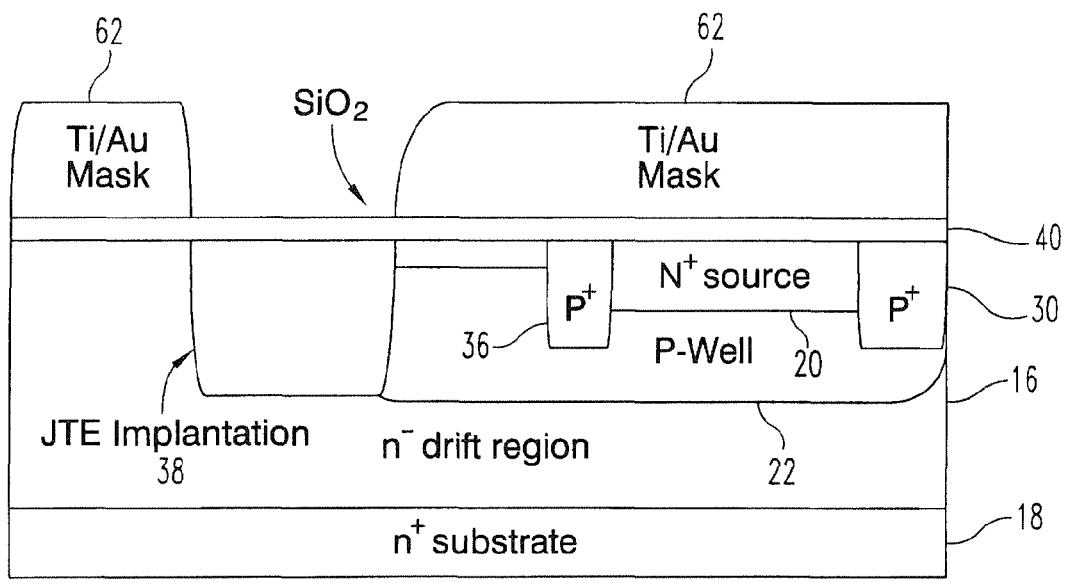

Masks 42 and 58 are then removed and another metal mask 60, e.g., Ti/Au, is formed over the n$^+$ source regions 20 and over the remainder of the substrate except where a p$^+$ contact region is desired, as shown in FIG. 6. A p$^+$ contact region 30 is then implanted in the center of each n$^+$ source region using mask 60 as also shown in the drawing. Metal mask 60 may then be removed With reference to FIG. 7, a cross-section of an edge portion of the device, a junction termination edge (JTE) 38 of p$^+$ material, e.g., boron, is implanted at the device edge using another metal mask 62. The JTE may overlap the p$^+$ well by 5-10 µm, for example, and may have a width on the order of 200 µm, or approximately three times the thickness of the epitaxial layer. The implants are then activated by high-temperature anneal in an inert atmosphere, preferably silane, after which electrical measurements such as $V_{BR}$ & TLM measurements may be made if desired. Metal mask 62 and oxide layer 40 are removed prior to activation of the implants.

Figure 8:
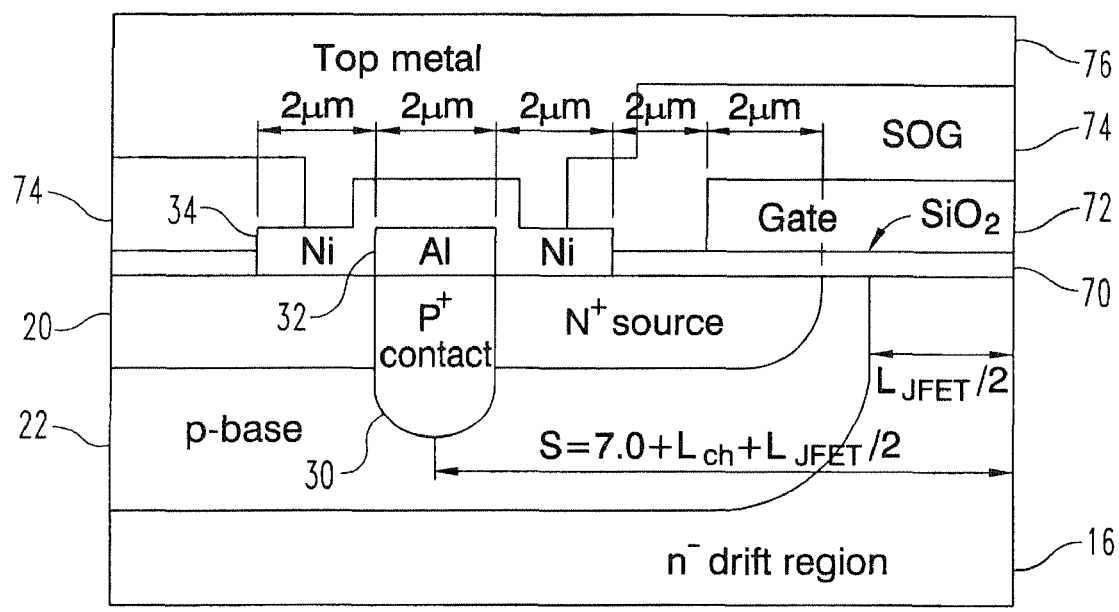

Referring to FIG. 8, in which example dimensions are shown, the gate oxide 70 is then formed by oxidation of the SiC surface and nitrogen oxygen (NO) post-oxidation anneal. A polysilicon layer is subsequently deposited to form the gate 72. The polysilicon is heavily doped with a spin-on dopant, the dopant is driven in, and the gate is patterned by RIE.

Then, another mask is used to etch about 6 µm of oxide at the center of the p$^+$ well as a metal contact window, another mask having a smaller window, e.g., 2 µm, is used to evaporate an Al contact 32, then the etch mask with the 6 µm window is used to evaporate a Ni contact 34 over the Al contact as shown in the drawing. The contacts are annealed, spin-on glass (SOG) 74 is uniformly deposited and then etched away to leave a window for the top metal 76, e.g., about 4 µm as shown or 6 µm if the mask for the nickel contact is used for this step, and Al is evaporated into the window and over the SOG as the top metal for the source contact. As can be appreciated from FIG. 8, there is no gap between the aluminum ohmic contact to the p-type base and the nickel ohmic contact to the n-type source, as there would normally be with a conventional metallization process. The method according to the present invention eliminates the alignment tolerance between the ohmic contacts to the base region and source region in a silicon carbide power MOSFET, thereby reducing the area of the device, reducing the specific on-resistance, and increasing the on-state current density.

Figure 9:
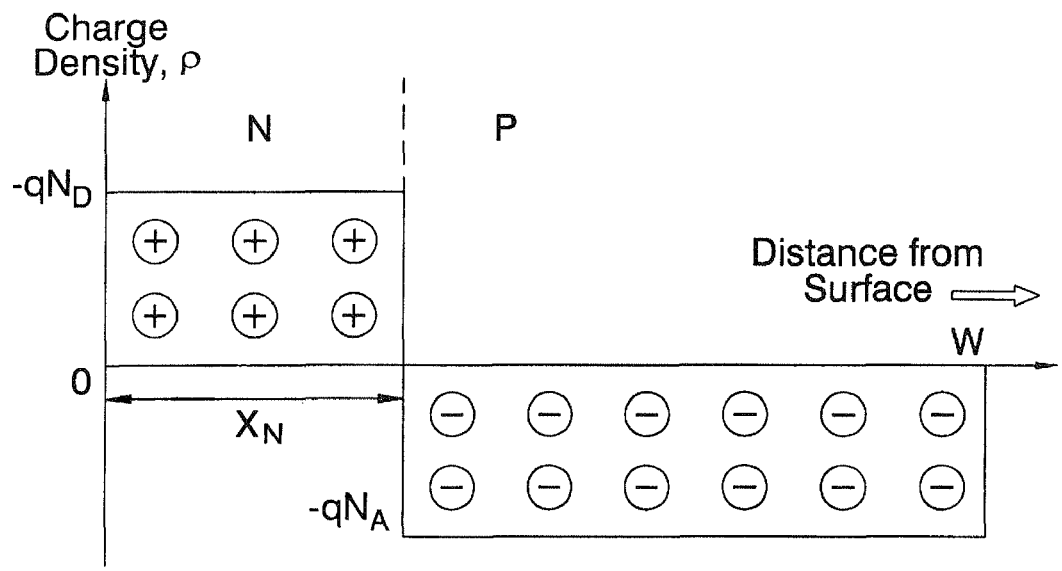
FIG. 9 is a graphical illustration of charge density and electric field as a function of distance from the SiC surface for a short-channel SiC DMOSFET according to the present invention.
Figure 9:
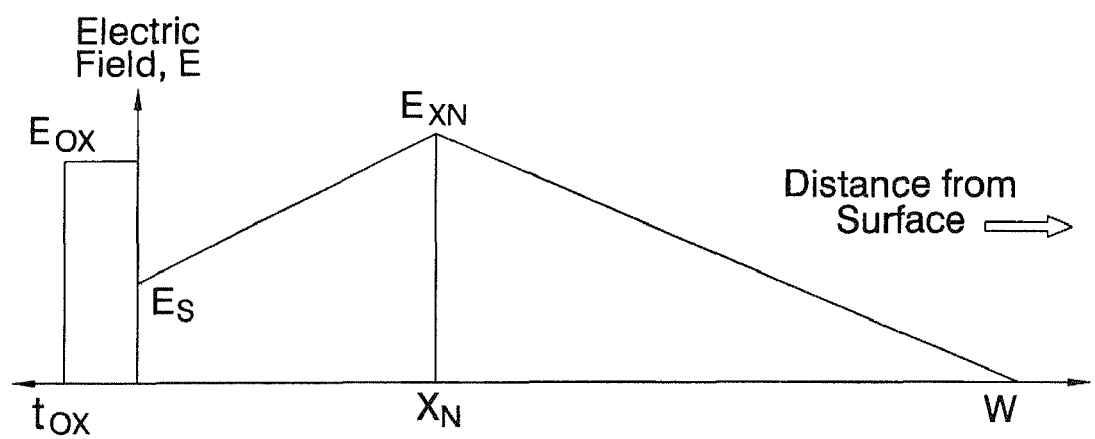

As indicated above, counter-doping is employed in the channel region in order to avoid a high oxide field at threshold. Short-channel devices offer lower channel resistance, which is dominant in silicon carbide power MOSFETs. However, the heavy doping of the base required to block high voltage and suppress leakage current makes the oxide field high at threshold and limits the device operation. More specifically, with high base dopings as described above for avoiding punchthrough, e.g., on the order of $1\times10^{18}$ cm$^{-3}$, the threshold voltage of the MOSFET becomes large, and the oxide field at threshold ($E_{OX,TH}$), which is given by $$E_{OX,TH} = \frac{1}{\varepsilon_{OX}}\sqrt{2q\varepsilon_s N_A(2\phi_F)}$$

reaches the value of $2.7\times10^6$ V/cm at a base doping of $N_A=1\times10^{18}$ cm$^{-3}$. This field is almost 70% of the maximum allowable oxide field of $4\times10^6$ V/cm, leaving little room to increase the gate voltage in order to induce inversion layer charge. However, we have discovered that this problem can be solved by introducing an n-type surface layer ($X_N$) that is fully depleted at zero gate voltage. The idea is illustrated in FIG. 9. Field lines from the donors in the depleted n layer terminate on acceptors in the depleted p layer, thereby reducing the electric field near the surface, and by extension the field in the oxide as well. It can be shown that the oxide field at threshold is now $$E_{OX,TH} = \frac{1}{\varepsilon_{OX}}\left[\sqrt{2q\varepsilon_s N_A(2\phi_F) + (qN_A X_N)^2(N_D/N_A+1)} - q(N_A+N_D)X_N\right]$$

For counter doping depth of $X_N=600$ Å and doping of $N_D=3.3\times10^{17}$ cm$^{-3}$ ($N_A=1\times10^{18}$ cm$^{-3}$), for example, $E_{OX,TH}$ is reduced to $4.7\times10^5$ V/cm (compared to $2.7\times10^6$ V/cm without the n layer). This allows significantly higher gate voltages to be applied to induce substantial charge in the inversion layer before reaching the limiting (maximum allowable) oxide field of 4 MV/cm.

The counter-doping is preferably limited to the channel region in order to avoid reducing the blocking voltage. For power DMOSFETs, the blocking voltage is supported mainly across the lightly doped n-drift region and p-well. 4H-SiC material has a 10 times higher critical electric field than that of silicon. Thus, the field in the gate oxide is much higher than in silicon MOSFETs during the off state. The field in the semi-conductor increases with higher doping in the JFET region. Therefore, counter-doping is avoided in the JFET region and limited to the channel region. This can be achieved by performing the counter-doping implantation together with the p-well implantation using the same photomask.

Another embodiment of the present invention is a short-channel SiC UMOSFET. In this embodiment, a short channel is achieved by forming the base epilayer with the desired thickness and doping. A surface n-type layer may be introduced by subsequent epigrowth following trench etch, but is preferably obtained by angled ion implantation into the trench sidewalls following trench etch. Ion implantation is preferred because the dose and depth can be controlled to about 10%, much more precisely than epigrowth.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected. For example, while the first and second conductivity types described above with reference to the preferred embodiments are n-type and p-type, respectively, a complementary structure, i.e., a p-channel device, is also contemplated as part of the present invention.

As another example, a useful modification to the invention is the addition of a "current spreading layer" (CSL) to minimize current crowding at the boundary between the JFET region and the drift region. The JFET region is that portion of the n-type drift region between the p-base regions, and extends from the oxide-semiconductor interface to the bottom of the p-base regions. The aforementioned current spreading layer (CSL) consists of an n-type layer of the same conductivity type as the drift layer but of higher doping, formed immediately below the p-type base regions. In the conducting state, electron current flows through the JFET region into the CSL, and once within the CSL the current spreads laterally before entering the drift region. This minimizes current crowding that would otherwise occur at the bottom of the JFET region, thereby reducing the on-resistance of the MOSFET. Another useful modification is the selective enhancement of the doping of the JFET region itself. Selectively increasing the doping of this region, for example by a "pocket" implant, can further reduce the on-resistance of the MOSFET. All of these modifications are envisioned as possible extensions and enhancements of the basic idea of a short-channel power MOSFET in SiC.

We claim:

1. A method of fabricating a silicon carbide power DMOSFET, comprising:
   providing a silicon carbide drain region of a first conductivity type;
   forming a silicon carbide base region of a second conductivity type above said drain region;
   forming a silicon carbide source region of said first conductivity type adjacent an upper surface of said base region;
   creating a channel extending from said source region through said base region adjacent a gate interface surface thereof, said channel having a length less than approximately 0.6 µm; and
   creating self-aligned base and source ohmic contacts;
   wherein said base region has a doping concentration of said second conductivity type sufficiently high that a potential barrier at the source end of the channel is not lowered by a voltage applied to the drain; and
   wherein said base region is formed by ion implantation using a polysilicon mask and said source region is subsequently formed in said upper surface of said base region by ion implantation using an implant mask formed by oxidation of the polysilicon mask.

2. The method of claim 1, further comprising forming a counter-doped surface layer in said channel region by implanting dopant atoms of said first conductivity type into said base region after formation thereof, said counter-doped layer configured to control the threshold voltage.

3. The method of claim 2, wherein said counter-doping is introduced with the same mask used for doping of said base region.

4. The method of claim 3, further comprising forming a silicon carbide drift layer of said first conductivity type between said base region and said drain region.

5. The method of claim 4, wherein said first conductivity type is n-type and said second conductivity type is p-type.

6. The method of claim 1, further comprising providing said channel region with a surface doping concentration of said first conductivity type of about $1\text{-}3\times10^{17}$ cm$^{-3}$, and a doping concentration of said second conductivity type of at least about $2.5\times10^{17}$ cm$^{-3}$ in a lower portion of said channel region.

7. The method of claim 6, wherein the bottom of said base region has a doping concentration of said second conductivity type of at least about $1\times10^{18}$ cm$^{-3}$.

8. The method of claim 7, wherein said doping of said channel region is performed by ion implantation after formation of said base region.

* * * * *